(12) United States Patent
Beamer

(10) Patent No.: US 6,933,059 B1
(45) Date of Patent: Aug. 23, 2005

(54) ELECTROSTATIC SHIELDING, LOW CHARGING-RETAINING MOISTURE BARRIER FILM

(75) Inventor: Brent Beamer, Cary, NC (US)

(73) Assignee: SCC Products, Inc., Sanford, NC (US)

( * ) Notice: Subject to any disclaimer, the term of this patent is extended or adjusted under 35 U.S.C. 154(b) by 0 days.

(21) Appl. No.: 09/720,932

(22) PCT Filed: May 7, 1999

(86) PCT No.: PCT/US99/10103

§ 371 (c)(1),
(2), (4) Date: Jan. 2, 2001

(87) PCT Pub. No.: WO00/67994

PCT Pub. Date: Nov. 16, 2000

(51) Int. Cl.$^7$ ............ B32B 15/00; B32B 7/12; B32B 3/00; B21D 39/00

(52) U.S. Cl. ............ 428/615; 428/621; 428/626; 428/344; 428/349; 428/458; 428/461; 428/922; 428/926

(58) Field of Search ............ 428/615, 344, 428/347, 349, 461, 922, 926, 931, 934, 9.35, 936, 937, 938, 939, 458, 622, 623, 624, 625, 626

(56) References Cited

U.S. PATENT DOCUMENTS

| | | | |
|---|---|---|---|
| 3,118,781 A | * | 1/1964 | Downing |
| 4,104,516 A | * | 8/1978 | Wang et al. ............ 250/214 VT |
| 4,154,344 A | * | 5/1979 | Yenni, Jr. et al. ........ 206/524.6 |
| 4,293,070 A | * | 10/1981 | Ohlbach ............ 206/328 |
| 4,424,900 A | * | 1/1984 | Petcavich ............ 206/328 |
| 4,496,406 A | * | 1/1985 | Dedow ............ 156/66 |
| 4,699,830 A | * | 10/1987 | White ............ 206/720 |
| 4,738,882 A | * | 4/1988 | Rayford et al. ............ 428/218 |
| 4,756,414 A | * | 7/1988 | Mott ............ 206/720 |
| 4,906,517 A | * | 3/1990 | Akao et al. ............ 264/176.1 |
| 4,971,196 A |  | 11/1990 | Kitamura et al. ............ 206/328 |
| 5,014,849 A | * | 5/1991 | Becker ............ 206/714 |
| 5,043,195 A | * | 8/1991 | Skrivseth ............ 206/524.6 |
| 5,091,229 A | * | 2/1992 | Golike et al. ............ 206/524 |
| 5,097,949 A | * | 3/1992 | Heldwein ............ 206/524.2 |
| 5,175,033 A | * | 12/1992 | Havens ............ 206/720 |
| 5,180,615 A | * | 1/1993 | Havens ............ 206/720 |
| 5,217,767 A | * | 6/1993 | Gutman et al. ............ 428/35.3 |
| 5,376,446 A | * | 12/1994 | Huang ............ 252/511 |
| 5,689,878 A | * | 11/1997 | Dahringer et al. ......... 174/52.2 |

* cited by examiner

Primary Examiner—Kevin R. Kruer

(57) ABSTRACT

A film material for use in packaging electrostatically sensitive components and corrosion sensitive components. The film material includes a static dissipative polymer attached to a first moisture barrier which in turn is attached to a second moisture barrier. The second moisture barrier has a low charge retaining coating. The first and second moisture barriers are separated by dielectric. Moisture barriers are formed by either a metal foil, or a metallized polymer in which the metallization thickness is at least 178 Angstroms thick. The metal of the second moisture barrier is in contact with the low charge retaining coating. The low charge retaining coating together with the metal in the second moisture barrier has a surface conductivity between $10^{-3}$ and $10^{-7}$ Siemens.

28 Claims, 2 Drawing Sheets

US 6,933,059 B1

ELECTROSTATIC SHIELDING, LOW CHARGING-RETAINING MOISTURE BARRIER FILM

This is a 371 U.S. national stage application of PCT/US99/10103, filed May 7, 1999, which was published in English under PCT Article 21(2).

BACKGROUND OF INVENTION

Electrostatic shielding films are used to form packages for a variety of electronic components. These films generally protect the component from electrostatic fields and voltages. As time has passed electronic components have become increasingly sensitive to electrostatic voltages and amperages. In addition, as tolerances for components become more exacting, changes in tolerances caused by corrosion become more important.

For example, the read/write heads of a disc drive fly over magnetically coated spinning disc and read the changes in the magnetic flux as data. As the head becomes more sensitive to changes in the magnetic flux, more data can be stored on the disc. Recently the disc drive industry began replacing inductive data reading heads with magnetoresistant (MR) and giant magnetoresistant (GMR) heads. These heads are many more times sensitive to magnetic flux than the prior heads. MR/GMR heads utilize thinner conductors and dielectrics as compared with inductive heads. This structure makes the heads far more sensitive to transient electrical current.

A common and unavoidable source of such transient electrical current is the human body. Static charge accumulates on the body through triboelectrification. The dynamic release of this stored charge through an electrostatic discharge can achieve impressive current and energy levels. Discharge from the body is simulated by a resistive/capacitive network with a resistance equal to 1500 ohms and a capacitance equal to 100 picofarads. Such an R/C network can produce voltages in excess of 15,000 volts. Testing of MR heads show changes in the resistance of the device with discharges of only 35 volts. More importantly, the magnetic failure threshold has also been shown to be 35 volts with current at 23 milliamps and energy at 0.9 nanojoules. Melting or pitting of the device layers occur at about 80 volts of discharge. Increased electrostatic protection of these devices is, therefore, increasingly important.

Corrosion of electronic components becomes increasingly important as the products become smaller and thinner. Corrosion is particularly important with respect to the MR heads. Because MR heads are more sensitive to magnetic flux they can be flown closer to the disc. Because the MR head can be flown closer to the disc, the space needed to store information is reduced. The space between the head and the disc may be less than 0.05 micrometers. As technology advances, this distance is decreasing. Because corrosion changes the dimensional tolerances between parts it becomes increasingly important to limit corrosion in electronic components which have close physical tolerances.

Most corrosion of electronic components is a function of the amount of moisture or water vapor the material is in contact with. Steps can be taken during manufacturing to exclude water vapor from the package by introducing dry air. However, during transportation, moisture vapor may penetrate the packaging.

Similarly measures are generally observed during the manufacture and mounting of MR/GR heads to avoid damage by transient currents from electrostatic discharge. All work surfaces are rendered free of static electricity, and special attention is focused on controlling the flow of charge from materials of dissimilar resistance. However, MR heads and similarly susceptible electronic components must be transported. For example, MR heads and assemblies containing MR heads are typically transported from the place where the head is manufactured to the place where the head is assembled, and then to the final drive assembly. During transport MR heads, and other electronic components are exposed to electrostatic discharge and water vapor. In order to provide a high level of protection, the material should shield the product from electrostatic charge, avoid charge retention, and prevent water vapor from penetrating the material.

Prior art products do not provide sufficient electrostatic and moisture protection. U.S. Pat. No. 4,699,830 issued to Mr. White on Oct. 13, 1987. Mr. White disclosed an inner layer of electrostatic material, a first metal layer, a single film layer, a second metal layer, and a thin clear abrasion resistant layer on the outer surface of the film material. This material was transparent. In order for the material to be clear the metal layers must be extremely thin, on the order of 20 Angstroms thick each. Metallic materials of this thickness are unable to provide sufficient protection against external voltages in excess of approximately 1,000 volts. In addition, metals sufficiently thin to be transparent will not provide a moisture barrier. Finally, the practical way to achieve metal layers sufficiently thin to be transparent is to vapor deposit such metals onto a plastic film. Vapor deposition on two surfaces of a single film layer as disclosed in White is difficult and expensive.

Another patent which attempts to address the issue of providing a moisture barrier and some electrostatic protection is U.S. Pat. No. 4,971,196 issued to Kitamura on Nov. 20, 1990. This patent discloses three embodiments, one of which is particularly relevant. This embodiment has a structure with an inner layer of polyethylene with antistatic attached to an aluminum foil layer which in turn is attached to a polyester film layer, and then attached to a conductive carbon loaded plastic layer, and finally a non-conductive acrylic type protective layer over the carbon conductive layer. This material suffers from several problems. While the aluminum foil and polymeric layer will provide a limited moisture barrier and electrostatic shielding, the outer polymer layers will retain charge. This charge retention may lead to electrostatic discharges which will damage the component inside the packaging when the component is removed from the package. Furthermore, because the moisture and electrostatic protection is in a single layer, any punctures, pinholes, and other small defects in this layer will compromise the protection. In addition, metal foils are more expensive than metallized polymers, and are more difficult to handle.

SUMMARY OF INVENTION

The present invention addresses the deficiencies in the prior art by providing a film having excellent electrostatic and moisture barrier properties while not retaining charge on the surface of the film. This low charge-retaining film material has dual moisture barriers that also serve as dual static shields. These moisture barriers are created by polymeric moisture barriers or by metal foil. In the preferred embodiment the first moisture barrier is a polymeric moisture barrier. A polymer, preferably polyester, polypropylene, nylon or polyethylene is used as a support structure for the first metallized surface. Metallization is by vapor depositing a layer of metal on the polymeric support structure. The metal is preferably aluminum, but could be steel, gold or copper. The first polymeric moisture barrier is attached to a heat sealable static dissipative polymer which is, preferably polyethylene, polypropylene or possibly polyurethane. A tie layer of an adhesive, or a polymer, may be used to attach the first polymeric moisture barrier to the heat sealable static dissipative polymer. The use of a heat sealable polymer allows the film to be heat sealed to itself, forming a bag, envelope, or the packaging material.

A second polymeric moisture barrier similar to the first is then attached to the first polymeric moisture barrier. A tie layer of preferably an adhesive or a possibly polyethylene or other polymer may be used to attach the first polymeric moisture barrier to the second polymeric moisture barrier. The adhesive is preferably a solvent born polyurethane base. The first metallized surface of the second metallized polymer faces away from the first polymeric moisture barrier. A low charge-retaining coating is placed over the metallized surface of the second metallized polymeric moisture barrier. The coating and the metallized surface together have a conductivity of between $10^{-3}$ and $10^{-10}$ Siemens, preferably $10^{-6}$ Siemens. When this film material is used to package electronic components, the first and second polymeric moisture barriers act as faraday cages protecting components from electrostatic discharge. The low charge retaining coating in contact with the metallized surface of the second metallized polymeric moisture barrier ensure that the package itself will not retain charge, but will quickly bleed any charge from the surface of the bag. The two polymeric moisture barriers limit moisture transmission protecting components placed in packaging made from this material from corrosion.

In the second preferred embodiment, a heat sealable static dissipative polymer, preferably polyethylene, is attached to a puncture resistant polymer, preferably a biaxly oriented nylon. This puncture resistant polymer serves as a dimensionally stable dielectric. The dimensionally stable dielectric is attached to a metal foil using a tie layer of preferably hot melt polyethylene. The metal foil layer is preferably an aluminum foil approximately 0.00035 inches thick. A second tie layer is preferably an adhesive to a polymeric moisture barrier with a first metallized surface and a second nonmetallized surface. This second nonmetallized surface of the polymeric moisture barrier is in contact with the second tie layer. The first metallized surface of the polymeric moisture barrier has a low charge-retaining coating. The first metallized surface of the polymeric moisture barrier and the low charge-retaining coating together have conductivity between $10^{-3}$ to $10^{-10}$ Siemens and preferably $10^{-6}$ Siemens.

In the third preferred embodiment a heat sealable static dissipative polymer is attached to a first polymeric moisture barrier similar in construction to the polymeric moisture barriers of the first embodiment. The polymeric moisture barrier is attached to a dimensionally stable dielectric polymer by a first tie layer preferably an adhesive. The puncture resistant polymer is preferably a biaxly-oriented nylon. This nylon serves as a dimensionally stable dielectric. A second tie layer, again preferably hot melt polyethylene, but possibly an adhesive, is used to attach the dimensionally stable dielectric polymer to a metal foil layer. The metal foil is preferably an aluminum foil approximately 0.00035 inches thick. This foil layer serves as the second moisture barrier and provides a faraday cage to provide electrostatic protection of components places inside of any packaging made from the film of this invention. A low charge retaining coating is placed over the foil. The coating and foil together have a surface conductivity of between $10^{-3}$ to $10^{-10}$ Siemens, preferably $10^{-6}$ Siemens. All three embodiments provide moisture barrier protection, high electric static shielding, and a low charge-retaining surface.

DETAILED DESCRIPTION OF THE DRAWING

An electrostatic protective barrier film that will not retain charge on the surface of the film has long been needed by the market place. The ideal film is: relatively inexpensive, provides electrostatic protection, does not retain charge, and provides a barrier to moisture penetration in order to prevent corrosion. Electrostatic shielding film material is frequently used to form bags, envelopes, and other packages. These packages are typically heat sealed to themselves. Therefore, the ideal film material for this purpose is heat sealable to itself.

The present invention solves these problems and others by providing electrostatic shielding and moisture protection for corrosion protection with a low charge-retaining surface. The invention uses a heat sealable static dissipative polymer as the base layer for the film material. This heat sealable static dissipative polymer will become the interior of any packaging material made from the film. This heat sealable static dissipative polymer allows charge to bleed off of any component placed inside the packaging material, and is resistant to triboelectrification which might occur when the component is placed inside the package. This heat sealable dissipative material is attached to a first moisture barrier which is either a polymeric barrier with a first metallized surface and a second nonmetallized surface or is a metal foil. The first moisture barrier is attached to a second moisture barrier which is either a polymeric moisture barrier with a first metallized surface and a second nonmetallized surface, or is a metal foil. A dielectric polymer separates the foil or metallized layers. The metallized surface of the polymeric support layer or metal foil serves as moisture barrier, and also acts as a faraday cage to electrically isolate material placed in the interior of a package from external influences. The metallized layers or the foil is sufficiently thick to protect against voltages of up to 12,000 volts. These layers may be repeated for additional protection. The top metallization layer or metal foil is covered by a low charge-retaining coating. This protects the metallization or metal foil layer below from nicks and scratches, and also allows any charge which may build up on the outer metal foil layer to bleed away preventing any electrostatic damage to components from charge retained on the surface of the package. This invention is best understood and described by the three embodiments discussed below.

The First Embodiment

Figure 1:
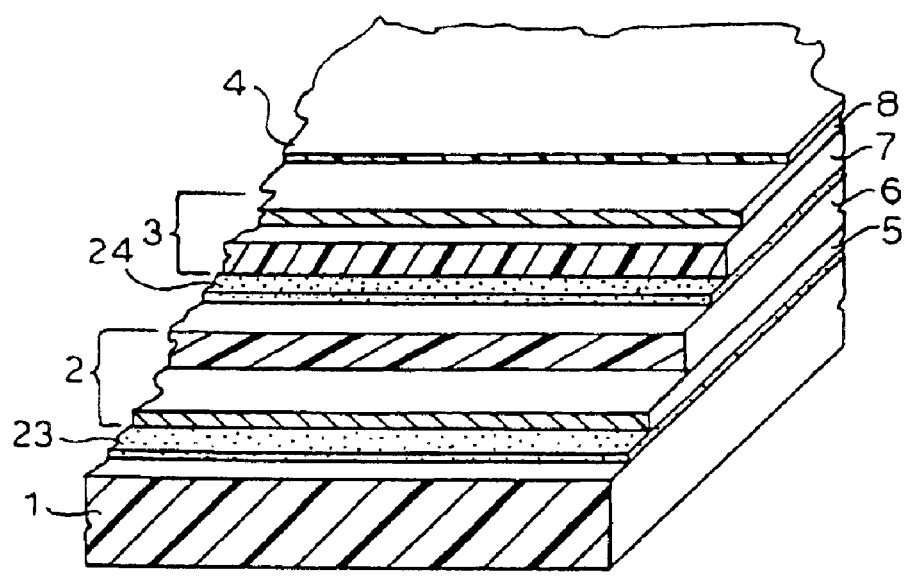
FIG. 1 shows a cross-sectional view of the first embodiment of this invention.
Figure 4:
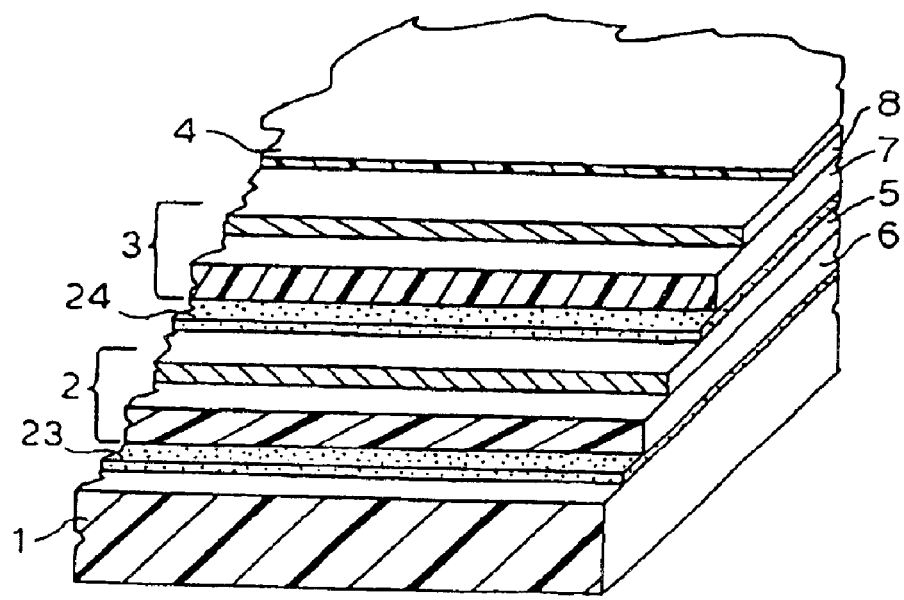
FIG. 4 shows a variation on the first embodiment of this invention.

The first embodiment is illustrated in FIGS. 1 and 4. In the first embodiment a heat static dissipative sealable polymer 1 forms the base layer of this film material. It is this heat sealable static dissipative polymer 1 when used in packaging material that will be oriented toward the inside of the packaging material and will be in contact with the electronic component being protected. This static heat sealable dissipative polymer 1 is preferably polyethylene of any thickness but, preferably 2.6 mm with a conductivity of between $10^{-1}$ Siemens and $10^{-10}$ Siemens. The heat sealable static dissipative polymer 1 may also be polypropylene or polyurethane. The polymer is made static dissipative by topically coating or volumetrically loading the polymer with hydroscopic surfactants or ionic compounds known as antistats. These may be one of a number of commercially available products from companies such as 3M, Dupont, or Dow Chemical. These materials are often quaternary ammonium salt compounds, tertiary amines, or tertiary amides.

The heat sealable static dissipative polymer 1 is attached to a first polymeric moisture barrier 2 by a tie layer 23. The first tie layer is preferably an adhesive such as a polyurethane based adhesive, but may be a hot melt polymer such as polyethylene. The first polymeric moisture barrier 2 has a first metallized surface 5 and a second nonmetallized surface 6. The polymer in the first polymeric moisture barrier is preferably polyester, but may be another polymer such as polypropylene, polyethylene, or nylon. The metallized surface 5 may be oriented either toward the static dissipative heat sealable polymer 1 or away from the static dissipative heat sealable polymer 1. The two orientations are shown in FIG. 1 and FIG. 4. The metallization on the first polymeric moisture barrier 2 is preferably a vapor deposited aluminum, although other metals such as copper, nickel, steel, gold or silver may be used. Sputter coating could also be used instead of vapor deposition. Sufficient metallization should be laid down to keep water vapor permeation to less than 0.04 grams per 100 sq. in. per 24 hrs. Aluminum is preferably used to metallize because of its expense and handling characteristics. If aluminum is used, the thickness of the aluminum on the first metallized surface 5 is between 170 to 400 Angstroms thick, preferably range is 290. When formed into a package this first polymeric moisture barrier 2 provides a faraday cage protecting components placed inside from electrostatic discharges.

The first polymeric moisture barrier 2 is attached to a second polymeric moisture barrier 3 by a second tie layer 24. The second tie layer 24 is preferably an adhesive such as polyurethane based adhesive, but may be a hot melt polymer such as polyethylene. The second polymeric moisture barrier 3 has a first metallized surface 8 and a second nonmetallized surface 7. The second polymeric moisture barrier 3 is similar in structure to the first polymeric moisture barrier 2 and made of similar materials. Although the first and second polymeric moisture barriers could be made of different materials, for ease in manufacturing and construction, the two materials in the preferred embodiments are the same. The first metallized surface 8 of the second polymeric moisture barrier 3 is oriented away from the heat sealable static dissipative polymer 1 and toward what will become the outer surface of any package made from the film material. In this first preferred embodiment a low charge retaining coating 4 is attached to the first metallized surface 8 of the second polymeric moisture barrier 3. This low charge-retaining coating 4 is a polymer, a preferably carbon loaded acrylic. Other polymers such as polyurethane, polyethylene, or polypropylene could be used. Other conductive particles may be used to load the polymers such as silver, copper, metal flake, stainless fiber, DuPont Zelic and the like. The low charge-retaining coating preferably has a conductivity of $1 \times 10^{-7}$ Siemens but may range between $1 \times 10^{-3}$ and $10-9$ Siemens. The second polymeric moisture barrier 3 acts as both a moisture barrier, and as a faraday cage to protect components placed beneath the material from electrostatic discharge. The low charge-retaining coating 4 allows any charge which may build on the material to bleed off slowly into the surrounding environment. The low charge-retaining coating also provides a physical protection to prevent holes or other damage to the first metallized surface 8 of the second polymeric moisture barrier 3. The combined conductivity of the low charge retaining coating and the first metallized surface of the polymeric moisture barrier is between $10^{-3}$ to $10^{-10}$ Siemens preferably $10^{-6}$ Siemens.

The Second Embodiment

Figure 2:
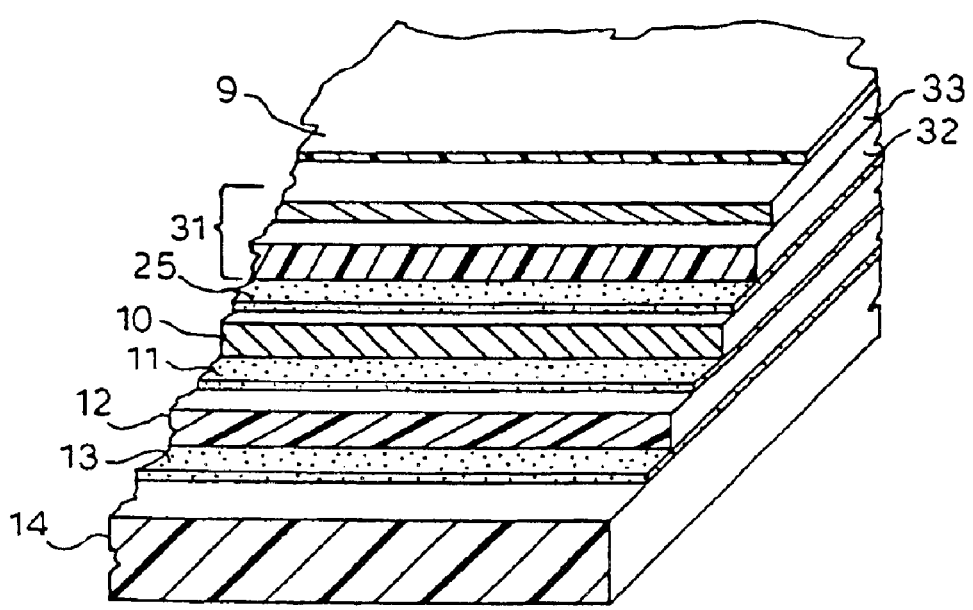
FIG. 2 shows a cross-sectional view of the second embodiment of this invention.

In the second preferred embodiment, illustrated in FIG. 2, a heat sealable static dissipative polymer 14 is attached to a dimensionally stable layer of dielectric polymer 12 preferably by a tie layer 13. The tie layer 13 is preferably a hot melt polyethylene but may be an adhesive. The heat sealable static dissipative polymer 14 has a preferred conductivity in the range of $10^{-7}$ to $10^{-10}$ Siemens. This polymer is preferably a polyethylene rendered low charging by topically coating or volumetrically loading with hydroscopic surfactants or ionic compounds known as antistats similar to those listed in the first embodiment. These materials reduce triboelectrification by allowing any charge which may be generated to be redistributed.

The dimensionally stable dielectric polymer 12 is preferably a biaxly-oriented nylon, Tyvek, or polyester. In turn it is attached to a second tie layer 11 which again is preferably a hot melt polyethylene but could be an adhesive layer. Polyethylene, Polyurethane acrylic polymer may also be used for the tie layer. The first tie layer 13, together with the puncture resistant polymer 12, and the second tie layer also serve as a dielectric to electrically isolate the package interior from current produced by an electrostatic discharge. The second tie layer attaches the dimensionally stable dielectric polymer 12 to a metal foil 10. The metal foil 10 is preferably aluminum, but may be of copper, gold, steel, nickel or silver. This metal foil 10 has a thickness of between 0.0002 and 0.0005 preferably 0.00035 inches. The metal foil 10 serves as the first moisture barrier, and provides electrostatic protection of components placed inside of packaging made from the film of this invention.

The metal foil 10 is attached with a third tie layer 25 to a polymeric moisture barrier 31. The third tie layer 25 is preferably an adhesive, but may be a hot melt polymer such as polyethylene. The polymeric moisture barrier 31 has a first metallized surface 33 and a second nonmetallized surface 32. The second nonmetallized surface 32 of the polymeric moisture barrier 31 is in contact with the third tie layer 25. The first metallized surface 33 of the polymeric moisture barrier 31 is in contact with a low charge retaining coating 9. The polymeric moisture barrier 31 is of the same construction as the polymeric moisture barriers 2 and 3 of the first embodiment. The low charge retaining coating 9 is the same construction as the low charge retaining coating 4 of the first embodiment, and together with the first metallized surface 33 of the polymeric moisture barrier 31 has a surface conductivity of between $10^{-3}$ and $10^{-3}$ Siemens, preferably $10^{-6}$ Siemens.

The Third Embodiment

Figure 3:
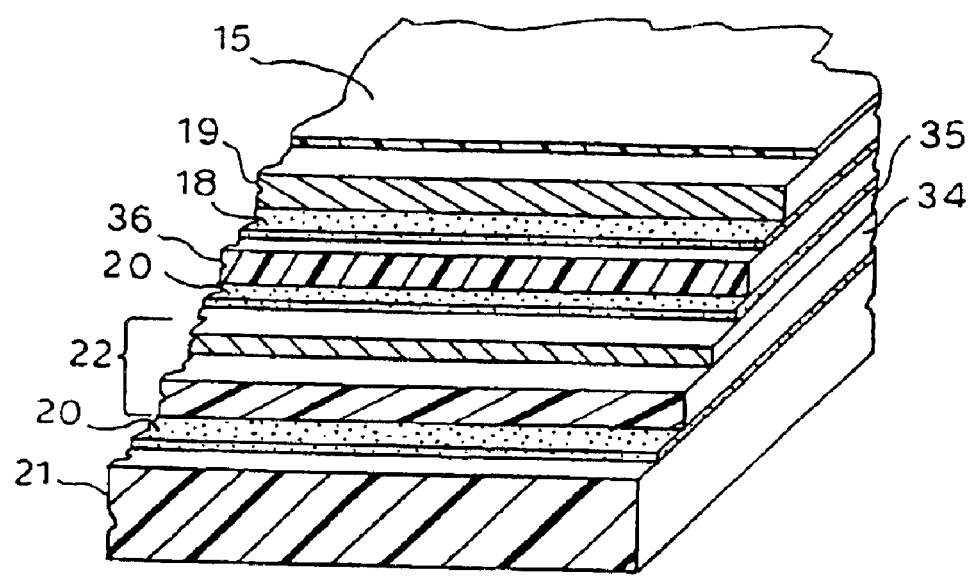
FIG. 3 shows a cross-sectional view of the third embodiment of this invention.

The third embodiment of this invention is illustrated in FIG. 3. The heat sealable static dissipative polymer 21 is attached using a first tie layer 20 to a polymeric moisture barrier 22. This polymeric moisture barrier 22 has a first metallized surface 35 and a second nonmetallized surface 34. A second tie layer 20 attaches a dimensionally stable polymer 36 to the polymeric moisture barrier 22. A third tie layer 18 attaches the dimensionally stable polymer 36 to a metal foil 19. The polymeric moisture barrier 22 is similar in construction to the polymeric moisture barrier 2 and 3 of the first embodiment. The tie layers are similar in construction to the other tie layers in this invention. The metal foil 19 is similar in construction to the metal foil 10 of the second embodiment. A low charge retaining coating 15 is placed over the metal foil 19. The low charge retaining coating 15 has a conductivity of $10^{-3}$ to $10^{-9}$ Siemens, preferably $10^{-7}$ Siemens. The low charge retaining coating is similar in construction to the low charge retaining coating 4 of the first embodiment. The metal foil 19 and low charge retaining coating 15 together have a surface conductivity of between $10^{-3}$ and $10^{-7}$ Siemens preferably $10^{-6}$ Siemens.

While three embodiments are set forth above, other variations are possible without departing from the spirit of this invention. A film material according to the invention will have a low rate of water vapor penetration, less than 0.02 grams per 100 square inches per 24 hours when tested in accordance with ASTM-F-1249, and is therefore in compliance with MilB-81705. The film material of this invention, when formed into a package will provide electrostatic shielding for components places inside such packaging to withstand voltages in excess of 12,000 volts.

It will be understood that the invention may be embodied in other specific forms without departing from the spirit or central characteristics thereof. The present examples and embodiments are to be considered in all respects illustrative and not restrictive, and the invention is not to be limited to the details given herein.

I claim:

1. A low charge retaining film material for packaging that protects items from electrostatic discharge and from moisture caused corrosion said material comprising:
    a) a heat sealable static dissipative polymer;
    b) a first moisture barrier, said first moisture barrier having a nonmetallized surface, wherein the nonmetallized surface is attached to the heat sealable static dissipative polymer by a first tie layer;
    c) a second moisture barrier attached to the first moisture barrier, said second moisture barrier having a metallized surface and a nonmetallized surface, wherein the nonmetallized surface is attached to a metallized surface of the first moisture barrier by a second tie layer; and
    d) a low charge retaining coating attached to the metallized surface of the second moisture barrier.

2. A film material as in claim 1 wherein the moisture penetration rate is less than 0.02 grams per 100 square inches per 24 hours.

3. A low charge retaining film material for packaging that protects items from electrostatic discharge and from moisture caused corrosion, said material comprising:
    a) a heat sealable static dissipative polymer;
    b) a first polymeric moisture barrier having two surfaces, a metallized surface and a nonmetallized surface, said nonmetallized surface of said first polymeric moisture barrier being attached to said heat sealable static dissipative polymer by a first tie layer;
    c) a second polymeric moisture barrier having two surfaces, a metallized surface and a nonmetallized surface, said nonmetallized surface of said second polymeric moisture barrier being attached to said metallized surface of said first polymeric moisture barrier by a second tie layer; and
    d) a low charge retaining coating attached to said metallized surface of said second polymeric moisture barrier.

4. A film material as in claim 3 wherein the moisture penetration rate is less than 0.02 grams per 100 square inches per 24 hours.

5. A material as in claim 3 wherein the first and second tie layers are adhesives.

6. A material as in claim 3 wherein the metal of each of the metallized surfaces of the first and second polymeric moisture barrier is aluminum and the aluminum is at least 170 Angstroms thick.

7. A material as in claim 3 wherein the heat sealable static dissipative polymer has a conductivity of between $10^{-1}$ and $10^{-10}$ Siemens.

8. A material as in claim 3 wherein the low charge retaining layer is a carbon loaded polymer with a conductivity of between $1 \times 10^{-3}$ and $1 \times 10{-9}$ Siemens.

9. A material as in claim 3 wherein the metallized surfaces of the first and second polymeric moisture barriers are vapor deposited aluminum.

10. A material as in claim 3 wherein the metallized surfaces of the first and second polymeric moisture barriers are vapor deposited nickel.

11. A material as in claim 3 wherein the metallized surfaces of the first and second polymeric moisture barriers are vapor deposited copper.

12. The material as in claim 3 wherein the low charge-retaining coating is a carbon loaded acrylic.

13. The material as in claim 3 wherein the metallized surface of the second moisture barrier is attached to the nonmetallized surface of the second moisture barrier by a third tie layer.

14. A low charge retaining film material for packaging that protects items from electrostatic discharge and corrosion said material comprising:
    a) a heat sealable static dissipative polymer;
    b) a first moisture barrier including a metal foil attached to said heat sealable static dissipative polymer, wherein said metal foil is attached to said heat sealable static dissipative polymer by a first tie layer;
    c) a second moisture barrier with a metallized surface and a nonmetallized surface said nonmetallized surface of said second moisture barrier being attached to a nonmetallized surface of the first moisture barrier by a second tie layer; and
    d) a low charge retaining coating attached to the metallized surface of the second moisture barrier.

15. A low charge retaining film material for packaging that protects items from electrostatic discharge and corrosion said material comprising:
    a) heat sealable static dissipative polymer;
    b) a first tie layer attached to the heat sealable static dissipative polymer;
    c) a polymeric moisture barrier having two surfaces, a metallized surface and a nonmetallized surface said nonmetallized surface being attached to the first tie layer;
    d) a second tie layer attached to the polymeric moisture barrier;
    e) a polymeric layer attached to the second tie layer;
    f) a third tie layer attached to the second polymeric layer;
    g) a metal foil attached to the third tie layer; and
    h) a low charge retaining coating attached to the metal foil.

16. A film material as in claim 15 wherein the heat sealable static dissipative polymer is an antistat treated polyethylene.

17. A film material as in claim 16 wherein the metal foil is comprised of aluminum foil, and wherein the metallization of the metallized surface of the polymeric moisture barrier is aluminum between 170 and 400 Angstroms thick.

18. A film material as in claim 17 wherein the moisture penetration rate is less than 0.02 grams per 100 square inches per 24 hours.

19. A low charge retaining film material for packaging that protects items from electrostatic discharge and corrosion said material comprising:
   a) a heat sealable static dissipative polymer;
   b) a dielectric polymer attached to the heat sealable static dissipative polymer by a first tie layer;
   c) a metal foil attached to the dielectric polymer to form a first moisture barrier;
   d) a second moisture barrier with a metallized surface and a nonmetallized surface said nonmetallized surface of said second moisture barrier being attached to the metal foil by a second tie layer; and
   e) a low charge retaining coating attached to the metallized surface of the second polymeric moisture barrier.

20. A film material as in claim 19 wherein the moisture penetration rate of the material is less than 0.02 grams per 100 square inches per 24 hours.

21. A low charge retaining film as in claim 19 wherein the dielectric polymer is attached to the metal foil by a third tie layer.

22. A film material as in claim 21 wherein the dielectric polymer is a biaxly oriented nylon.

23. A film material as in claim 22 wherein the second moisture barrier is a metallized polyethylene.

24. A film material as in claim 23 wherein the metallized surface is aluminum between 170 and 400 Angstroms thick.

25. A film material as in claim 21 wherein the first tie layer, the second tie layer, and the third tie layer are adhesives.

26. A film material as in claim 25 wherein the low charge retaining coating and the metallized surface of the second moisture barrier together have a surface conductivity of between $10^{-3}$ and $10^{-9}$ Siemens.

27. A film material as in claim 25 wherein the metal foil is an aluminum foil.

28. A film material as in claim 27 wherein said film has a thickness of between 0.0002 inches and 0.0005 inches.

* * * * *